United States Patent [19]

North et al.

[11] Patent Number: 5,541,521

[45] Date of Patent: Jul. 30, 1996

[54] EMI TEST SYSTEM AND DECOUPLING NETWORK THEREFOR, THE DECOUPLING NETWORK HAVING SERIES CONNECTED RESONATORS WITH TORROIDAL CORES FORMED FROM A FERRITE COMPOSITION

[75] Inventors: Terry M. North, Clinton Township; James J. Yuzwalk, Oxford, both of Mich.

[73] Assignee: Chrysler Corporation, Auburn Hills, Mich.

[21] Appl. No.: 308,228

[22] Filed: Sep. 19, 1994

[51] Int. Cl.$^6$ .................................................. G01R 27/28
[52] U.S. Cl. ............................................ 324/628; 324/627
[58] Field of Search ..................................... 324/627, 628, 324/520, 521, 522, 546, 548; 333/165, 166

[56] References Cited

U.S. PATENT DOCUMENTS 4,763,062  8/1988  Trzcinski et al. ...................... 324/628

OTHER PUBLICATIONS

Paper entitled "An Electromagnetic Immunity Diagnostic Tool For Electronic Circuits" presented at The 1991 International Symposium on Electromagnetic Compatibility.

Authors: James P. Muccioli and Terry M. North.

Primary Examiner—Kenneth A. Wieder
Assistant Examiner—Diep Do
Attorney, Agent, or Firm—Christopher A. Taravella

[57] ABSTRACT

Development of worst case operating environment, interfering parameters of a test item, is effected by a decoupling device. The device includes a series of resonators configured and interconnected in a particular manner along with a shunt capacitance. Each resonator has a torroidal core formed from a ferrite composition. When connected between the test item and its support system, the device provides such an impedance to signals other than those needed for normal operation, that the highest noise voltage levels emit from the test item. These levels permit developing repeatable worst case interference parameters which provide a guide for modifying the test item circuit components and connectors so as to minimize the effects of generating EMI sources or to immunize susceptible receptors within the test item.

18 Claims, 4 Drawing Sheets

5,541,521

EMI TEST SYSTEM AND DECOUPLING NETWORK THEREFOR, THE DECOUPLING NETWORK HAVING SERIES CONNECTED RESONATORS WITH TORROIDAL CORES FORMED FROM A FERRITE COMPOSITION

BACKGROUND OF THE INVENTION

1. Field of the Invention

This invention relates to conducted electromagnetic interference (EMI) testing and more particularly in a preferred embodiment to decoupling apparatus and methods used to determine EMI sources and receptors within electrical equipment.

2. Description of the Prior Art

Various techniques have been employed to detect, measure and then suppress EMI in sensitive electrical equipment or test items. Interference or susceptibility detection and measuring should be conducted with the test item operating as close to service conditions as possible. Also the test item normally is operated in its intended manner with anticipated inputs applied and its outputs normally loaded.

A problem exists with simulating service conditions and normal manner of operation. To bring a test item out of its normal operating environment and to place it on a bench for a test, an actual duplication of operation of the test item seldom occurs. For example, if in a vehicle equipped with an engine control system that includes a microcomputer as a controller, assume it is desired to use a particular portable mobile two-way radio. Discovering that the radio works when the engine is cutoff but doesn't work well while the engine is running, the engine control system is then removed from the vehicle and placed in a bench test environment for study. A simulator (support for the engine control system) is used to make the control system work as if it is in the vehicle. Also assume the system responds as if it is operating in the vehicle controlling what it is supposed to be controlling. Assume also, the engine control system generates the same interference that it was putting out before it was placed on the bench; but now the interference reacts with the simulator. By virtue of change in wiring, the coupling between harnesses, other components and the impedance and length of wires, the engine control system generally radiates and conducts a different amount of interference.

Efforts have been made to standardize bench test setups in order to gain data that approaches actual circumstances.

In prior bench tests under similar circumstances, line impedance stabilization networks (LISN's) have been recommended in a number of interference and susceptibility specifications, for insertion in power leads to offer something approaching a standard impedance to the radio frequency (RF) current from test items. The LISN's, as required by some military specifications introduce a standard 50 ohm power-source impedance for the test item so that conducted RF interference measurements can be compared to pass/fail limits without accounting for a source-impedance variable. However, in several LISN designs, a 5-microhenry coil is used, so the device is suitable for use from 150 KHz to 25 MHz. Over this range, the source-impedance varies from about 5 ohms at 150 KHz to 50 ohms at 25 MHz. It is not usable much above 25 MHz due to stray impedance. While it does furnish a standard impedance, it is not the impedance seen in the normal installation. It was never intended to be anything other than an A.C. power lines simulator.

Normally when trying to identify the potential of a device being an interference source, it is thought that this determination depends upon how you measured the interference emanating from the source. This implies that different test processes produced different results for the same interference source. Realizing the above conditions exist, efforts were made toward devising interference measuring technique that didn't depend upon how the interference was measured.

The present invention is an improved apparatus and method over the system as taught in U.S. Pat. No. 4,763,062 of the present assignee for analyzing EMI emissions and/or susceptibility of test items under bench test conditions. Currently, a series of resonators are configured and interconnected in a particular manner along with a shunt capacitance network to form a decoupling device. This decoupling device, usually disposed between the test item and its support system, provides a means for coupling dc and lower frequency signals needed for normal test item operations, but decouples essentially all other high frequency signals. Interfering signals from the test item confront essentially open circuit impedance with respect to the decoupling network input and the test item is forced to produce its highest noise voltage, the decoupling network acting as a worst case load with respect to the output of the test item.

Departing from the normal approach to noise studies of detecting, measuring and then suppressing EMI, using the decoupling network and testing for worst case interference parameters provide a repeatable scheme for determining worst case signals in any environment in which the test item may be employed. After establishing worst case interference parameters, modification techniques of test item circuit components and connectors may be employed to minimize the effect of generating EMI sources or to immunize susceptible receptors within the test item.

This improved apparatus contains a reduced number of resonators formed from a particular material and a single capacitor rather than a capacitance network. The apparatus of the present invention provides an extended frequency range at greater than 500 ohms impedance.

BRIEF SUMMARY OF THE INVENTION

The present invention is concerned with apparatus and methods used for analyzing EMI emissions and/or susceptibility of test items under bench test conditions. A series of resonators are configured and interconnected in a particular manner along with a shunt capacitance to form a decoupling device. Each resonator has a torroidal core formed from a ferrite composition. This decoupling device, usually disposed between the test item and its support system, provides a means for coupling dc and lower frequency signals needed for normal test item operations but decoupling essentially all other high frequency signals. Interfering signals from the test item confront essentially open circuit impedance with respect to the decoupling network input; and the test item is forced to produce its highest noise voltage, the decoupling network acting as a worst case load with respect to the output of the test item.

Improving upon the normal approach to noise studies of detecting, measuring and then suppressing EMI, using the decoupling network and testing for worst case interference parameters provide a repeatable scheme for determining worst case signals in any environment in which the test item may be employed. After establishing worst case interference parameters, modification technique of test item circuit components and connectors may be employed to minimize the affect of generating EMI sources or to immunize susceptible receptors within the test item.

DETAILED DESCRIPTION OF A PREFERRED EMBODIMENT

Figure 1:
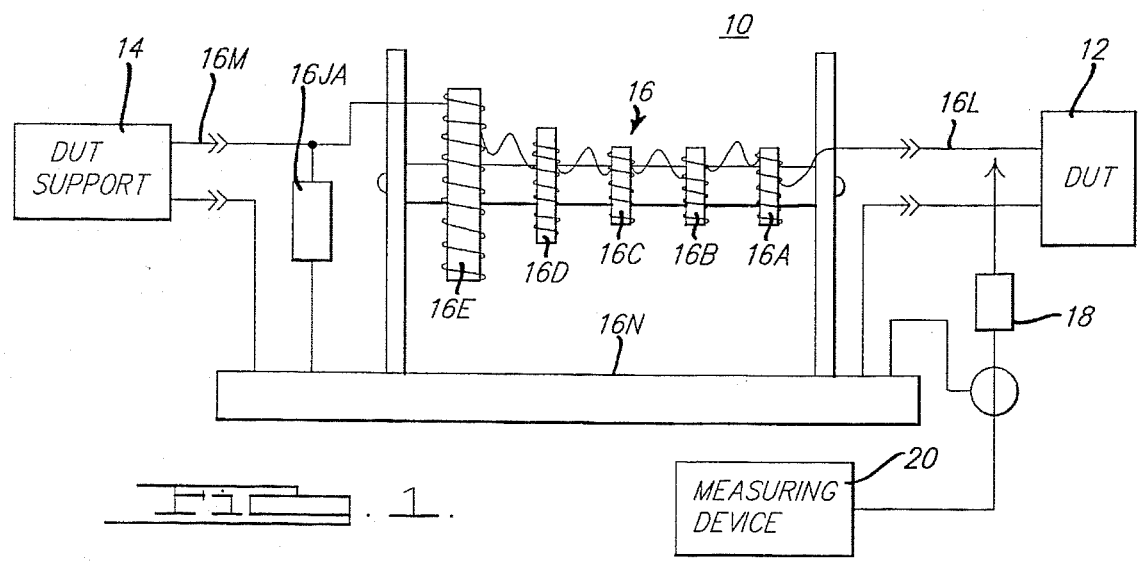
FIG. 1 is a side view of a decoupling network within a block diagram of a bench test setup for analyzing EMI.

FIG. 1 is a side view of an improved decoupling network within a block diagram of a bench test setup 10 for analyzing EMI. A test item or device under test (DUT) 12 is coupled to its DUT support 14 via a decoupling network 16. The support 14 provides all the power and data signals necessary to operate the DUT. Illustratively, the DUT 12 may be an engine control system that includes a microcomputer as a controller and the DUT support 14 may be a simulator that makes the engine control system function just as it would in a vehicle providing, e.g., the necessary voltages and sensor inputs and output loads.

Coupled between the input 16L of the decoupling network 16 and conventional measurement instrumentation 20, is a conventional high impedance probe 18 for coupling noise signals from the input side of the decoupling device to the instrumentation. The instrumentation may be the type used to obtain time or frequency analysis data.

Decoupling network 16 presents a low passband to the signals from DUT support 14 necessary for DUT operation and essentially an open circuit impedance to signals from both the DUT and its support within a chosen frequency band. Measurements of open circuit noise voltages from the DUT are desired.

Figure 2:
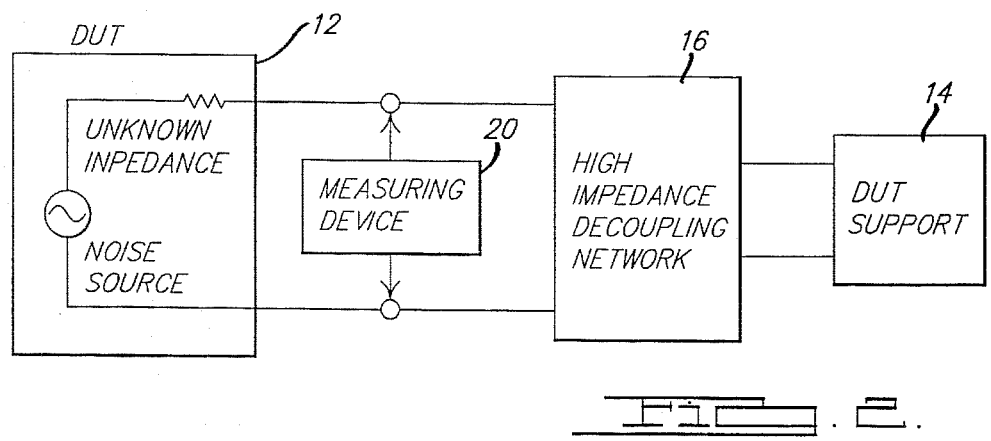
FIG. 2 is a block diagram of a noise source with an unknown impedance being measured using a high impedance decoupling network to evaluate its worst case noise potential.

When one is interested in open circuit voltage measurement, you load the DUT into the highest impedance one can reasonably obtain. FIG. 2 is a block diagram illustrative of a test setup for evaluating worst case noise potential of DUT 12. DUT 12, which receives support power from DUT support 14, includes a noise source with an unknown impedance. High impedance decoupling network 16 impels DUT 12 to emit worst case noise voltage signals which measuring device 20 assesses.

To achieve this high impedance, a serially connected network of inductance resonators 16A through 16E of FIG. 1 has been developed which operates effectively over a broad band of frequencies shunted by capacitor 16J which also operate over a broad band of frequencies.

Figure 4A:
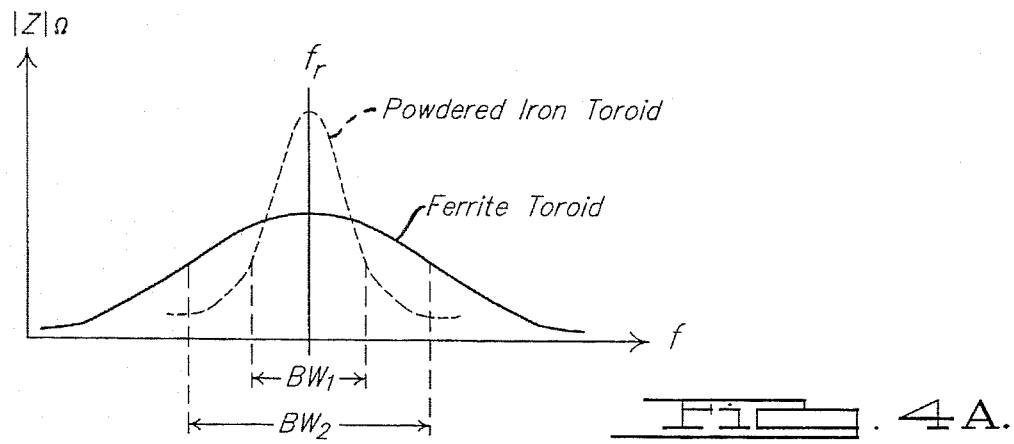
FIG. 4A is a comparison of curves showing improved bandwidth of ferrite toroid over powdered iron.
Figure 4B:
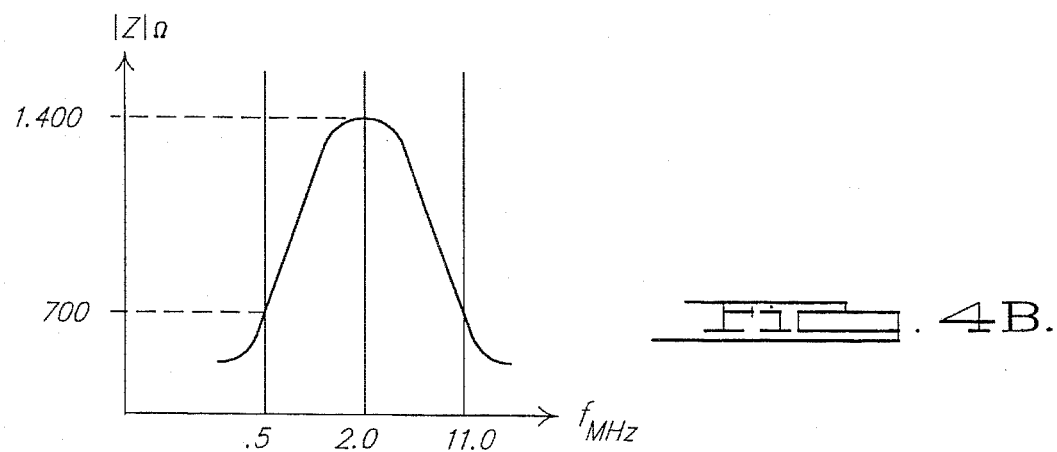
FIG. 4B is a "Q" curve for a particular resonator.
Figure 4C:
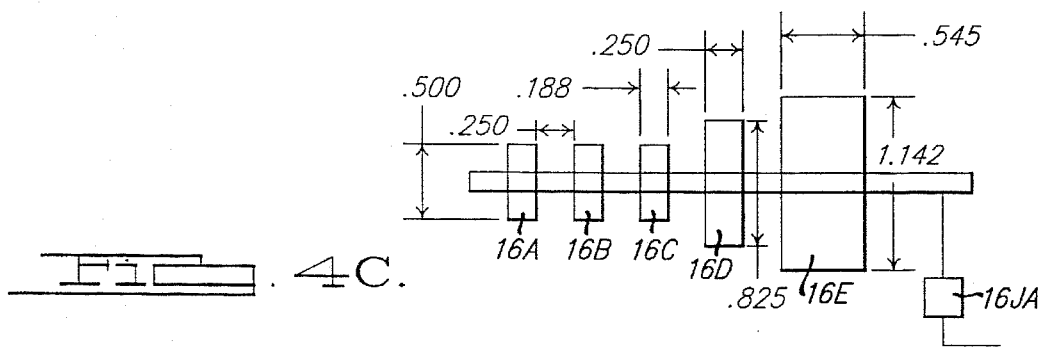
FIG. 4C is a plan view of the decoupling network.
Figure 4D:
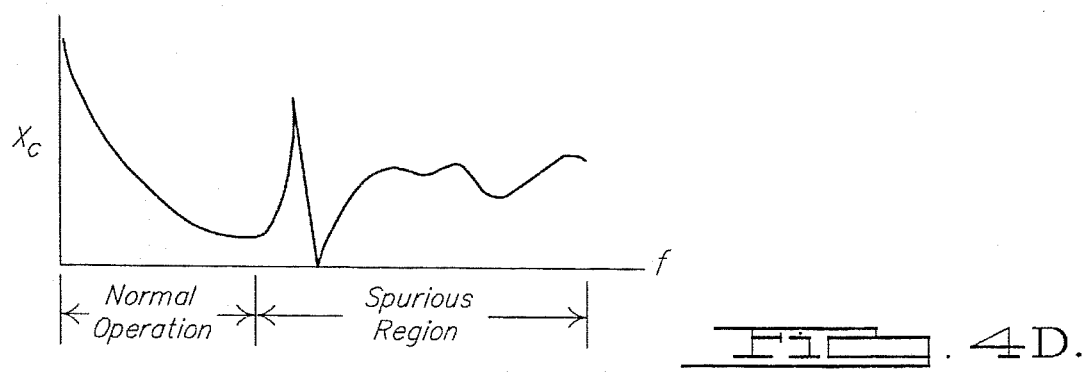
FIG. 4D is a response curve for a typical bypass capacitor used in this invention.
Figure 4E:
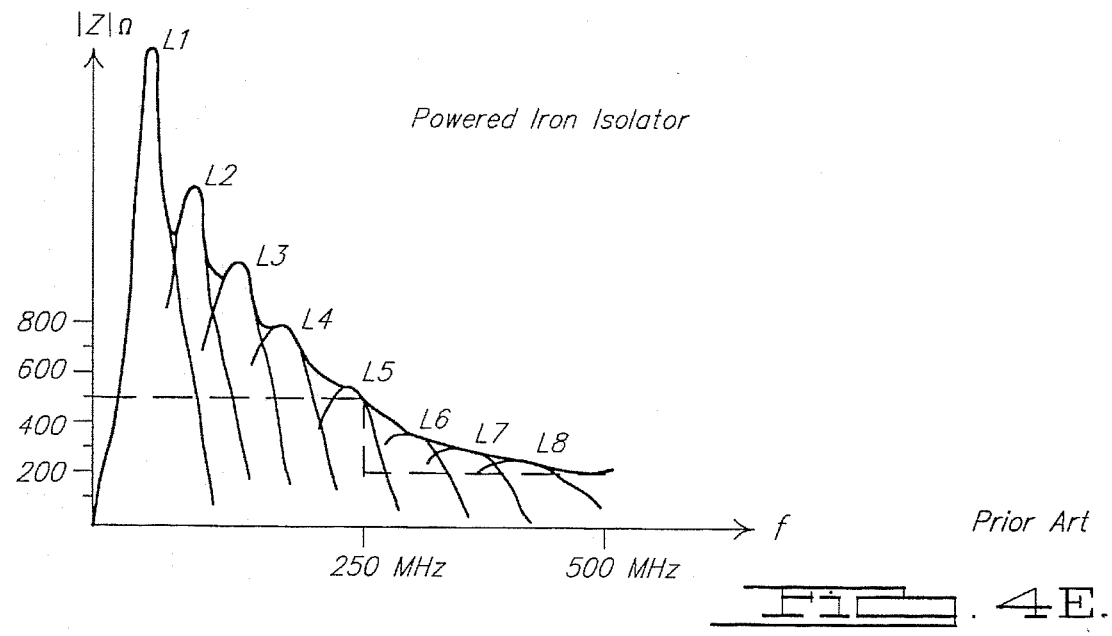
FIG. 4E is the response curve for the prior art decoupling network.
Figure 4F:
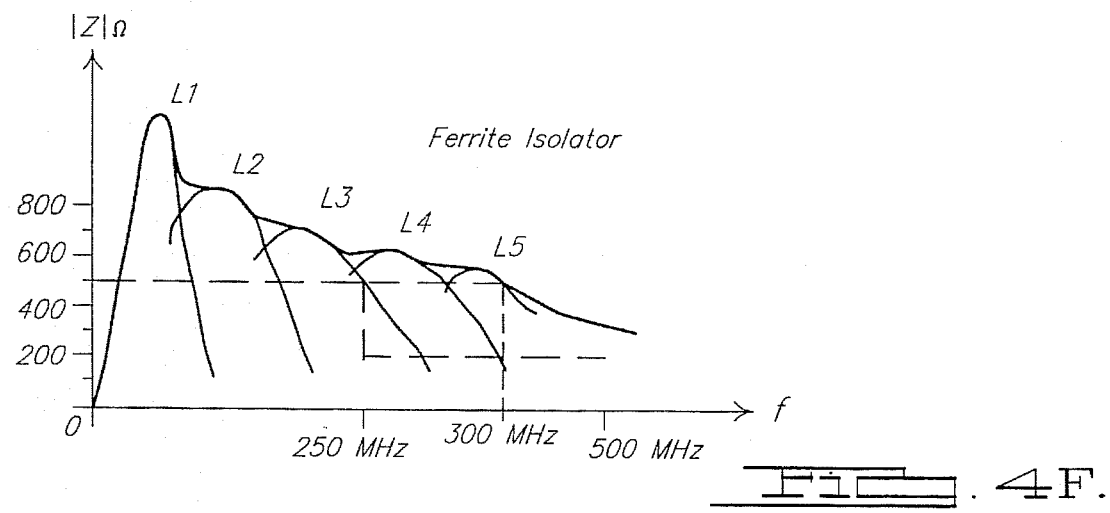
FIG. 4F is the response curve for the present decoupling network.

In this preferred embodiment, the decoupling network 16 is designed to produce substantially maximum uniform input impedance over a frequency range illustratively from 500 KHz to 500 MHz (see FIG. 4F). Network 16 provides DC resistance of about 0.06 ohms for DC currents up to about 2 amperes.

To tailor the decoupling network to meet the above requirements, several steps must be taken along with several design compromises. Realizing that the intent is not to design an ideal filter, but rather to design a device that causes the DUT 12 to emit worst case noise voltages, a high impedance network should be formed.

Realizing that every inductor resonates at some specific frequency and that it exhibits its maximum impedance at its parallel resonance, the limitation on its usefulness as a decoupling isolator is the "Q" value which must be high enough to meet the minimum impedance desired but low enough to provide an acceptable bandwidth.

To form a high impedance network which spans a broad range of frequencies, cascaded resonators must be formed. If maximum "Q" networks are used, a very large number of high "Q" networks would be required. Thus to gain a broad band high impedance network yet not employ an excessive number of high "Q" networks, a compromise should be made. To form the preferred embodiment, one should optimize the impedance of a chosen number of networks so as to provide at least a minimum impedance of 500 ohms to 250 MHz and 200 ohms to 500 MHz for the voltages that each network will confront. Also the "Q" of each coil should be low enough to gain as much bandwidth of coverage for each cascaded impedance.

Typically, parameters for winding inductors are specified by core manufacturers. The data supplied by the manufacturers is usually sufficient for winding inductors of practically any value within the limits of the core and wire materials. But, however, such data isn't suitable for forming a cascaded set of resonators used in this invention. Also, with respect to saturation of the core, one should avoid establishing DC magnetizing forces that would saturate the core at the desired current range of the decoupling network. Thus, the manufacturer's core data should be consulted for magnetic characteristics of the selected core material.

Figure 3:
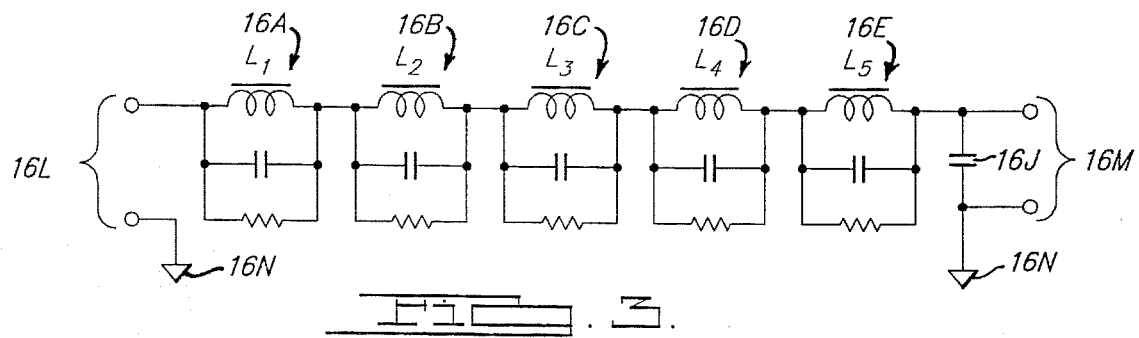
FIG. 3 schematically depicts the decoupling network of this invention.

Since the decoupling network 16 isn't a filter but a high input impedance cascaded resonator device, an equivalent circuit of the decoupling network is depicted in FIG. 3 illustrating the equivalent components. The resonators are designated 16A–16E. Each resonator is formed from an inductor in parallel with a resistor and a capacitor to form a tuned circuit of a chosen center frequency and a specific "Q". The parallel capacitance result from stray capacitance which occurs between windings about the toroidal cores. The resistors result from the DC resistivity of the windings and the magnetic core losses.

A terminating end of the lowest frequency resonator 16E and one end of the ground plane 16N disposed a chosen parallel distance from the resonators is shunted by a parallel bypass capacitor, shown in the equivalent circuit as a capacitance 16J. The output terminals 16M taken from across the shunt forms a single ended decoupler output. A lead end of the highest frequency resonator 16A and another end of the ground plane 16N are connected to an input terminal 16L to form a single ended decoupler input.

In establishing the number of resonators needed for the coupling network of FIG. 1, one must take into account the relationship between (a) the core material, wire size, the number of turns of wire employed in constructing cores that resonate at chosen frequencies and (b) the amount of bandwidth achieved when lowering the "Q" to provide for (1) an optimum impedance across a broadband of noise frequencies without core saturation and (2) a passband for desired voltage signals. As shown in FIG. 4A, there is depicted a graph comparing the effective bandwidth of the ferrite toroidal cores with the prior art powdered iron cores. By taking from or adding windings to the cores, an optimum "Q" and bandwidth for each core at a chosen related resonant frequency is established.

FIG. 4B illustrates a plot of absolute impedance values versus frequency in megahertz which indicates optimum "Q" for resonator 16E of FIG. 1 calibrated to resonate at 2 MHz and to provide high impedance from a lower 3 db frequency of 0.5 MHz to an upper 3 db frequency of 11 MHz. Each succeeding resonator 16D through 16A is adjusted similarly to form a family of resonators with increasing resonant frequencies with overlapping bandwidths as depicted in FIG. 4F.

In order to obtain the impedance characteristic as depicted in FIG. 4F, care must be exercised in tuning each resonator as they are assembled into a unit on a dielectric rod. The spacing between individual resonators must be maintained as depicted in FIG. 4C to control parasitic. The windings must be made utilizing one continuous piece of wire. Furthermore, the windings shall be closely spaced and located as far as possible from the ground plane 16N.

A similar procedure is performed for the bypass capacitor 16J. Again we look at the DUT 12 of FIG. 1 and determine what signal frequencies and voltages are required for normal operation. For the DUT 12 to operate, the limitations of the capacitor must be considered. FIG. 4D depicts reactance versus frequency of a typical capacitor which might be used with DUT 12. It is desired that DUT 12 drive the network at operating ranges of frequencies used by DUT 12, so that the network will pass the signals. As for the interfering signal frequencies, the capacitor should provide a known, impedance return path to ground. As in FIG. 4D, normally as you go higher in frequency, the reactance of the capacitance goes down. When you continue to go higher in frequency, series resonance is reached and the reactance drops way down. At frequencies above the resonance, the reactance rises and then spurious reactions occur.

The operation of system 10 will now be discussed. With reference of FIG. 1, the input connected 16L of decoupling network 16 is coupled to DUT 12 and the output connector 16M is connected to the output of DUT support 14. If we assume that DUT 12 is the engine controller mentioned supra, and that it requires dc and a 12 KHz clock signal which can be fed from the DUT support 14 over the single ended decoupling network 16 to DUT 12. If we assume the DUT 12 operates normally when the signals from DUT support 14 are supplied due to the pass band capabilities of network 16, the interfering signal voltages leaving DUT 12 will run into the high impedance of network 16 and be reflected back towards the DUT 12. Since the input to network 10 will appear as an open circuit network, the interfering voltages will increase to establish a worst case interfering signal voltage. Then a high impedance probe 18 can be connected across the input terminal 16L to obtain a time or frequency domain reading on suitable measurement equipment 20 of the worst case noise voltage emanating from DUT 12. Then a variety of suppression techniques may be employed to minimize this worst case voltage, presenting the user with a line by line analysis tool that departs from the usual approach of detecting, measuring and then attempting to suppress the interfering voltages for the DUT without specific source information.

Figure 5:
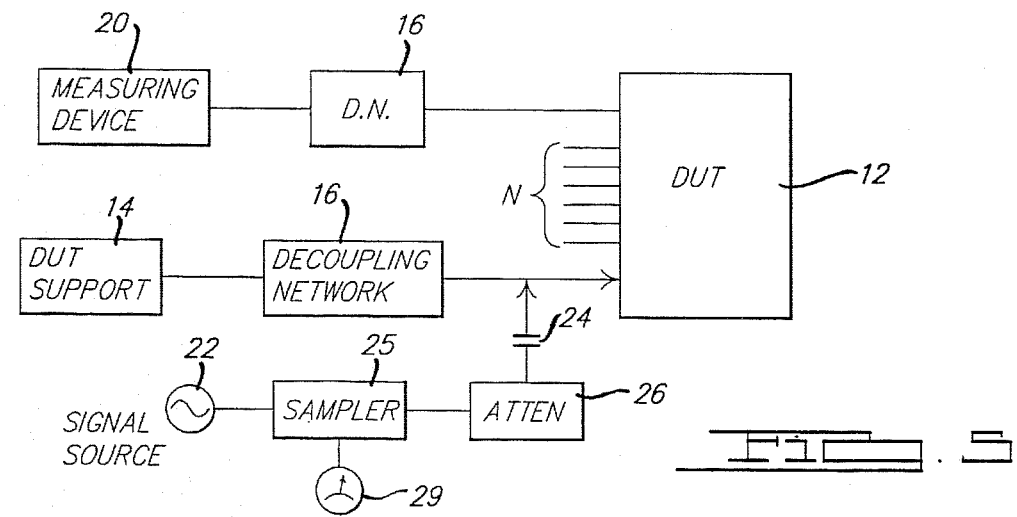
FIG. 5 is a block diagram of a susceptibility bench test setup in accordance with this invention.

FIG. 5 depicts another use for the decoupling network in analyzing the susceptibility of DUT 12 to noise. Here, a signal generator 22 is used as a substitute interference source for what are suspected to be potential interfering devices in the service environment. The generator 22 is coupled to the input of decoupling network 16 via a dc blocking capacitor 24, an attenuator 26, and a conventional voltage sampler 25. The generator's output is monitored by an RF voltmeter 29. The attenuator 26 should be connected as close as possible to the DUT. Suitable measurement equipment 20 may be coupled through another decoupling network 16 to the input of DUT 12 to gain a measure of susceptibility of DUT 12.

Having developed a broadband high impedance decoupling network to evaluate open circuit interference voltages, with a minor modification, short circuit current measurements can be made as well. This will give a measure of the current potential of interference sources.

Figure 6:
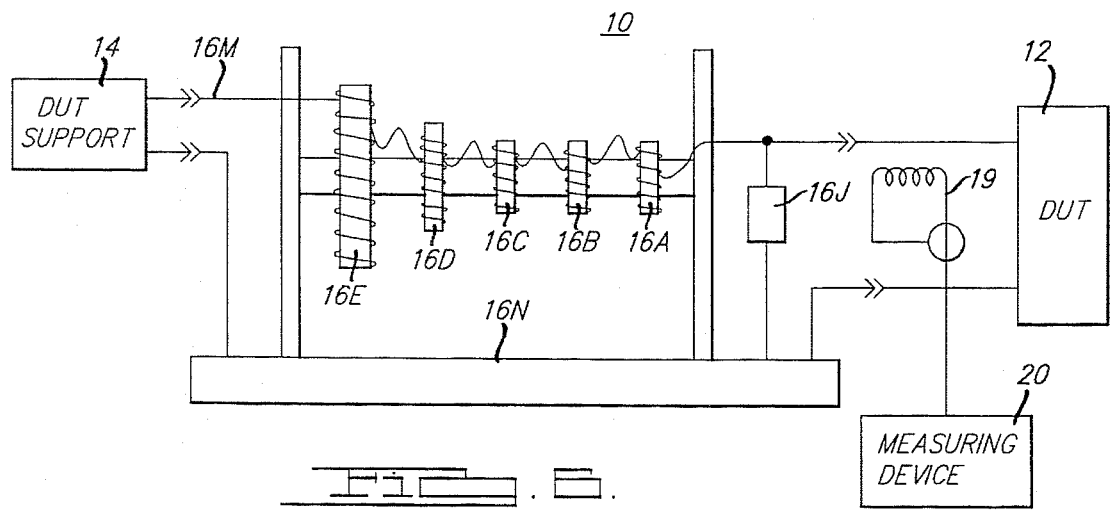
FIG. 6 is a side view of a decoupling network within a block diagram of a bench test setup for measuring short circuit currents.

This modified network is shown in FIG. 6 where the same capacitor 16J is placed at the DUT end rather than at the other end of the network forming a low impedance load for shunting the interference current to ground 16N. A current probe 19 is used on this shunted line for providing a current signal to measuring device 20 to measure worse case interference currents.

TABLE I

| BROADBAND ISOLATOR - 2 AMP RATING | | | | | |
|---|---|---|---|---|---|
| COIL # | CORE | #TURNS | 1 (uH) | f MHz | H (Oe) |
| 16E | FT114A-77 | 8 | 86 | 2 | 2.72 |
| 16D | FT82-43 | 6 | 20 | 50 | 2.88 |
| 16C | FT50-67 | 6 | 1 | 100 | 4.98 |
| 16B | FT50-68 | 4 | .2 | 150 | 3.32 |
| 16A | FT50-68 | 4 | .2 | 225 | 3.32 |

TABLE II

| BROADBAND ISOLATOR - 0.5 AMP RATING | | | | | |
|---|---|---|---|---|---|
| COIL # | CORE | #TURNS | 1 (uH) | f MHz | H (Oe) |
| 16E | FT82-77 | 12 | 180 | 3 | 1.43 |
| 16D | FT50-61 | 4 | 1 | 72 | 0.83 |
| 16C | FT50-67 | 4 | 0.6 | 100 | 0.83 |
| 16B | FT50-68 | 4 | 0.2 | 150 | 0.83 |
| 16A | FT50-68 | 4 | 0.2 | 200 | 0.83 |

NOTE: 16J is a 0.047 microfarad monolithic capacitor.

Table I and Table II specify parameters of two forms of decoupling network 16 used to develop the preferred embodiment of this invention. A 0.047 microfarad monolithic capacitor serves as bypass capacitor 16J. FIG. 4C also provides related structural data regarding the core type and diameters for the 2 amp form of the device.

Figure 7:
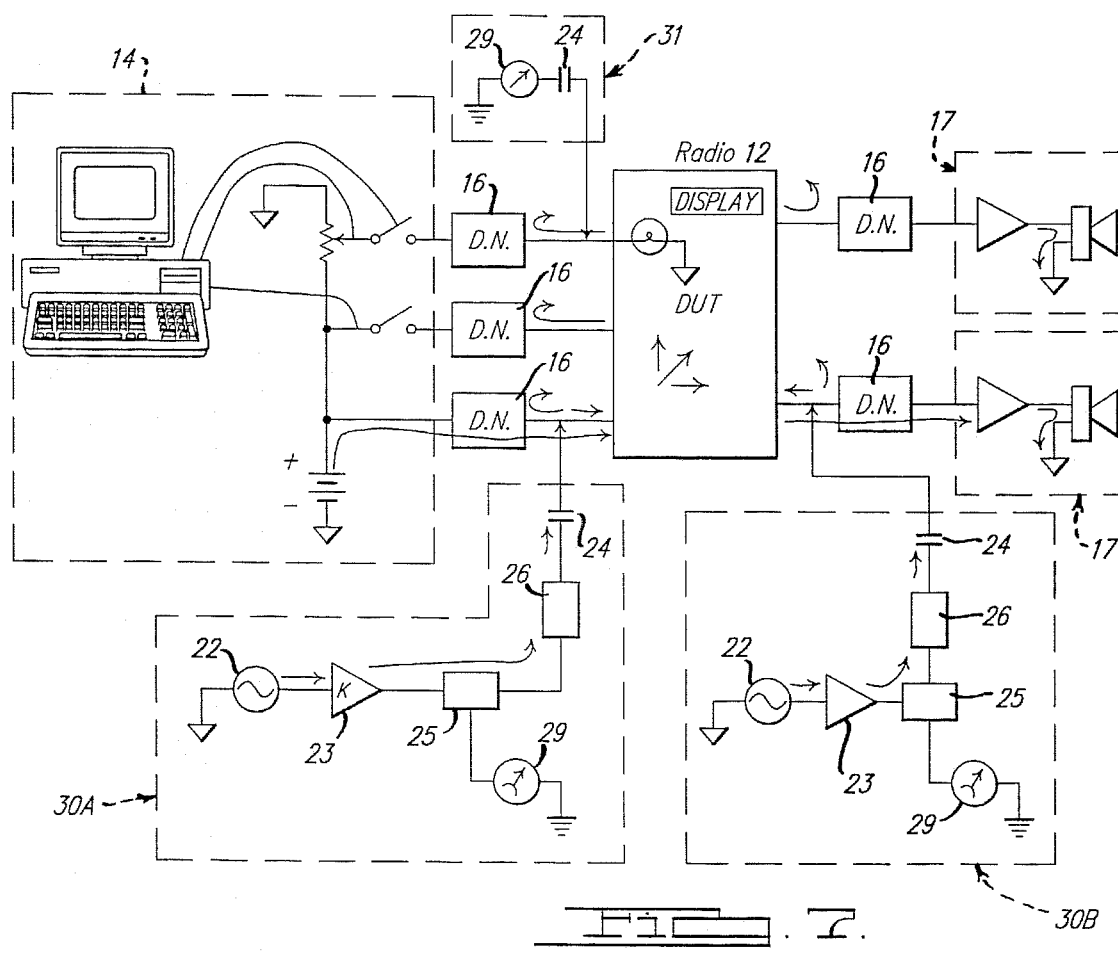
FIG. 7 is a composite diagram depicting both RF immunity and RF emission testing of a vehicle radio system.

To further illustrate the use of the decoupling network, refer to FIG. 7. There, decoupling networks 16—16 are placed between the support 14 and the individual input lines to radio 12. Also, decoupling networks are placed between the output lines of radio 12 and amplified speakers.

A signal source 22, an amplifier 23, a conventional voltage sampler 25, an RF voltmeter 29, an attenuator 26 and a D-C blocking capacitor are assembled to form an immunity test system 30. An RF voltmeter 29 and a D-C blocking capacitor 24 is used to form an RF emissions measuring system 31.

Immunity test system 30 is employed to force worst case RF on each input line of the radio to simulate operation in a worst case environment. We then observe the radio including its display and audio output for normal operation. If injection on any line leads to abnormal operation, then corrections on the associated circuit can be made.

A similar procedure may be used to check RF immunity off output line of radio 12. An independent test of each input or output line of the radio for conductive RF emission may be conducted using the RF emission measuring system 31. System 31 measures RF emissions emanating from the input or output line of the radio 12 under normal operating conditions. If excessive RF signals are present, correction to the associated circuit in radio 12 can be made.

A person skilled in the art may make various changes and substitutions to the layout of parts shown without departing from the spirit and scope of the invention.

What is claimed is:

1. A conductive electromagnetic interference test system determining electromagnetic interfering source components and receptor components within a device under test at worst case electromagnetic interference conditions, said system comprising:

(a) means for supplying power and signal support to said device under test;

(b) measuring means coupled between said power and signal support means and said device under test, said measuring means being responsive to electromagnetic interference voltage signals transferred between said power and signal support means and said device under test;

(c) a decoupling means disposed with an output end coupled to an output of said power and signal support means and an input end coupled to the device under test for coupling power and signal support to said device under test while opposing the passage of selected electromagnetic interfering voltage signals from both said device under test and said power and signal support means, said decoupling means providing a substantially worst case high impedance load for said device under test while said device under test is operating in response to the power and signal support from said support means, the high impedance load causing interfering voltage signals from said device under test to confront substantially an open circuit impedance with respect to an input of said decoupling means, and causing said device under test to produce a worst case interference voltage signal which can be measured by said measuring means to provide a reference upon which a repeatable measure of an interference voltage signal can be determined when interference suppression techniques are applied to rid or reduce electromagnetic interfering source and receptor components of said device under test;

(d) said decoupling means including a plurality of serially connected resonators, each of said resonators being tuned to a selected resonance frequency and a particular "Q" and bandwidth so as to create the particular high impedance load to oppose a closer broadband of electromagnetic signals, said decoupling means including five series connected resonators disposed on a dielectric rod with a first of the resonators at the input end of the decoupling means and a fifth of the resonators at the output end of the decoupling means, the torroidal cores of the first, second and third resonators having a diameter of about 0.500 inches and a thickness of about 0.188 inches, the torroidal coil of the fourth resonator having a diameter of about 0.825 inches and a thickness of about 0.250 inches, and the torroidal core of the fifth resonator having a diameter of about 1.142 inches and a thickness of about 0.545 inches, the torroidal core of the resonators spaced from each other a distance of about 0.250 inches; and (e) each resonator having a torroidal core made from a ferrite composition.

2. Apparatus in accordance with claim 1 wherein the high impedance load has a minimum impedance of 500 ohms at a maximum frequency of the interference voltage signal that each resonator confronts.

3. Apparatus in accordance with claim 1 wherein said decoupling means includes a ground plane spaced a chosen parallel distance from said plurality of serially connected resonators, wherein a lead of a maximum resonant frequency resonator and one end of said ground plane forms a single end input of said decoupling means.

4. Apparatus in accordance with claim 3 wherein said decoupling means includes a bypass capacitor shunted across a terminating end of a minimum resonance frequency resonator and another end of said ground plane which forms a single end output of said decoupling means, said capacitor being chosen to provide a low impedance return path to said ground plane for the interference voltage signals without opposing passage of operating frequency voltage signals to said device under test.

5. Apparatus in accordance with claim 4 wherein each resonator of said plurality of serially connected resonators includes a closely space loop of a chosen number of turns of said resonators at a location spaced a maximum distance from said ground plane, wherein said resonators are equally spaced on a dielectric rod.

6. The apparatus of claim 1 wherein the decoupling means has a capacity of about 0.5 amps, the first resonator having a FT50-68 torroidal core with four turns of wire, the second resonator having a FT50-68 torroidal core with four turns of wire, the third resonator having a FT50-67 torroidal core with four turns of wire, the fourth resonator having a FT50-61 torroidal core with four turns of wire, and the fifth resonator having a FT82-77 torroidal core with twelve turns of wire.

7. The apparatus in accordance with claim 6 wherein the turns of wire on the torroidal cores are made with a single wire.

8. The apparatus of claim 1 wherein the decoupling means has a capacity of about 2 amps, the first resonator having a FT50-68 torroidal core with four turns of wire, the second resonator having a FT50-68 torroidal core with four turns of wire, the third resonator having a FT50-67 torroidal core with six turns of wire, the fourth resonator having a FT82-43 torroidal core with six turns of wire, and the fifth resonator having a FT114A-77 torroidal core with eight turns of wire.

9. The apparatus in accordance with claim 8 wherein the turns of wire on the torroidal cores are made with a single wire.

10. A conductive electromagnetic interference test system determining electromagnetic interfering source components and receptor components within a device under test, at worst case interference conditions, said system comprising:

(a) means for supplying power and signal support to said device under test;

(b) measuring means coupled between said power and signal support means and said device under test, said measuring means being responsive to short circuit currents transferred between said power and signal support means and said device under test;

(c) a decoupling means disposed with an output end coupled to an output of said power and signal support means and an input end coupled to the device under test for coupling power and signal support to said device under test while opposing the passage of selected electromagnetic current and voltage signals from both said device under test and said power and signal support means, wherein said decoupling means includes a parallel connected bypass capacitor shunted across a leading end of a maximum resonance frequency resonator and a first end of said ground plane forming a singled ended input of said decoupling means, said capacitor forming a low impedance load for the short circuit current without opposing passage of operating frequency voltage and current signals to said device under test, said decoupling means having a shunted current path between said device under test and said capacitator wherein said interference current signals can be measured by said measuring means to provide a reference upon which a repeatable measure of interference current signals can be determined when interference suppression techniques are applied to eliminate or reduce electromagnetic interfering components of said device under test;

(d) the maximum resonance frequency resonator comprising a plurality of series connected resonators, including five series connected resonators disposed on a dielectric rod with a first of the resonators at the input end of the decoupling means and a fifth of the resonators at the output end of the decoupling means, the torroidal cores of the first, second and third resonators having a diameter of about 0.500 inches and a thickness of about 0.188 inches, the torroidal coil of the fourth resonator having a diameter of about 0.825 inches and a thickness of about 0.250 inches, and the torroidal core of the fifth resonator having a diameter of about 1.142 inches and a thickness of about 0.545 inches, the torroidal core of the resonators spaced from each other a distance of about 0.250 inches; and (e) each resonator having a torroidal core made from a ferrite composition.

11. A broadband high impedance decoupling network for an electromagnetic interference test system, the decoupling network having a plurality of series connected resonators, the improvement comprising each resonator having a torroidal core formed from a ferrite composition and the decoupling network having five series connected resonators disposed on a dielectric rod with a first of the resonators at a first end of the decoupling network and a fifth of the resonators at a second end of the decoupling means, the torroidal core of the first, second and third resonators having a diameter of about 0.500 inches and a thickness of about 0.188 inches, the torroidal coil of the fourth resonator having a diameter of about 0.825 inches and a thickness of about 0.250 inches, and the torroidal core of the fifth resonator having a diameter of about 1.142 inches and a thickness of about 0.545 inches, the torroidal cores of the resonators spaced from each other a distance of about 0.250 inches.

12. The decoupling network of claim 11 wherein the decoupling network includes at least one shunt capacitor coupled in parallel with the series connected resonators.

13. The decoupling network of claim 12 wherein the decoupling network further includes only one shunt capacitor coupled in parallel with the series connected resonators.

14. The decoupling network of claim 11 wherein the decoupling network has said first end for coupling to a device under test and said second end for coupling to a source of power and signal support for the device under test.

15. The decoupling network of claim 14 wherein the decoupling network has a capacity of about 0.5 amps, the first resonator having a FT50-68 torroidal core with four turns of wire, the second resonator having a FT50-68 torroidal core with four turns of wire, the third resonator having a FT50-67 torroidal core with four turns of wire, the fourth resonator having a FT50-61 torroidal core with four turns of wire, and the fifth resonator having a FT82-77 torroidal core with twelve turns of wire.

16. The decoupling network of claim 14 wherein the decoupling network has a capacity of about 2 amps, the first resonator having a FT50-68 torroidal core with four turns of wire, the second resonator having a FT50-68 torroidal core with four turns of wire, the third resonator having a FT50-67 torroidal core with six turns of wire, the fourth resonator having a FT82-43 torroidal core with six turns of wire, and the fifth resonator having a FT114A-77 torroidal core with eight turns of wire.

17. The decoupling network of claim 15 wherein the turns of wire are made with a single wire.

18. The decoupling network of claim 16 wherein the turns of wire are made with a single wire.

* * * * *